(12) United States Patent
Martinez et al.

(10) Patent No.: US 8,517,750 B2
(45) Date of Patent: Aug. 27, 2013

(54) INTERCHANGEABLE UV LED CURING SYSTEM

(75) Inventors: Aaron D. Martinez, Arvada, CO (US); Stephen J. Metcalf, Hudson, WI (US)

(73) Assignee: Air Motion Systems, Inc, River Falls, WI (US)

( * ) Notice: Subject to any disclaimer, the term of this patent is extended or adjusted under 35 U.S.C. 154(b) by 313 days.

(21) Appl. No.: 12/868,827

(22) Filed: Aug. 26, 2010

(65) Prior Publication Data
US 2011/0128680 A1     Jun. 2, 2011

Related U.S. Application Data

(60) Provisional application No. 61/237,436, filed on Aug. 27, 2009, provisional application No. 61/237,455, filed on Aug. 27, 2009, provisional application No. 61/267,021, filed on Dec. 5, 2009.

(51) Int. Cl.
*H01R 13/62* (2006.01)

(52) U.S. Cl.
USPC ........... 439/196; 439/372; 439/310; 101/487; 101/424.1

(58) Field of Classification Search
USPC .............. 439/196, 372, 310; 101/424.1, 487; 361/679.01
See application file for complete search history.

(56) References Cited

U.S. PATENT DOCUMENTS

| | | | | |
|---|---|---|---|---|
| 4,402,038 | A | * | 8/1983 | Hartung et al. .................. 362/20 |
| 5,564,765 | A | * | 10/1996 | Schuerch et al. .......... 294/81.56 |
| 5,748,837 | A | * | 5/1998 | Lokar et al. .................... 392/411 |
| 5,934,780 | A | * | 8/1999 | Tanaka ............................. 362/19 |
| 8,038,282 | B2 | * | 10/2011 | Claeys .......................... 347/102 |
| 2005/0104946 | A1 | | 5/2005 | Siegel |
| 2006/0192829 | A1 | | 8/2006 | Mills |
| 2008/0143806 | A1 | | 6/2008 | Claeys |
| 2009/0045714 | A1 | | 2/2009 | Claeys |
| 2011/0049392 | A1 | * | 3/2011 | Martinez et al. ........... 250/492.1 |

OTHER PUBLICATIONS

International Search Report for PCT/US2010/046840, counterpart PCT application.

\* cited by examiner

*Primary Examiner* — Gary F. Paumen
(74) *Attorney, Agent, or Firm* — Wm. Larry Alexander

(57) ABSTRACT

Design and integration of a UV LED curing system into a multi-station UV-curing process, such as for inkjet or offset printing. Docking ports may be permanently mounted into various stations within the UV-curing process. The UV LED lamps may be modular and may therefore be inserted into any one of the desired docking ports at variable distances from the substrate to be cured without significant loss of optical uniformity or radiant intensity. The docking ports are designed such that they can accommodate UV LED lamps of differing wavelengths and, therefore, power requirements. The insertion of a UV LED lamp into a docking port is designed such that it is accomplished without tools and may be considered a "plug and play" operation. Multiple docking ports may be mounted into a single station in the UV-curing process to allow for the installation of multiple lamps at each station.

23 Claims, 15 Drawing Sheets

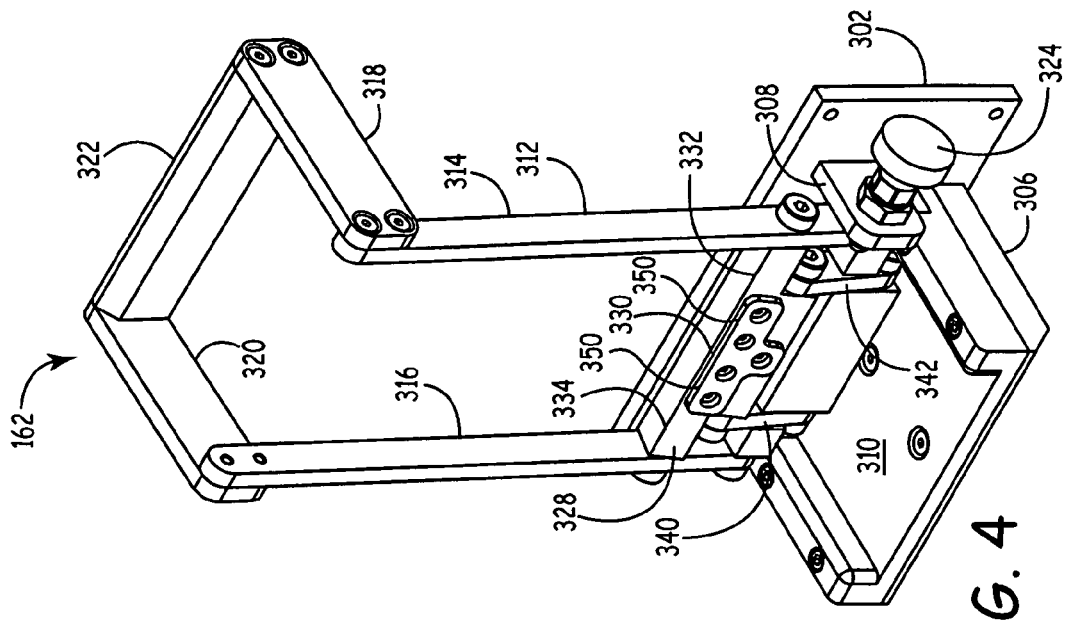
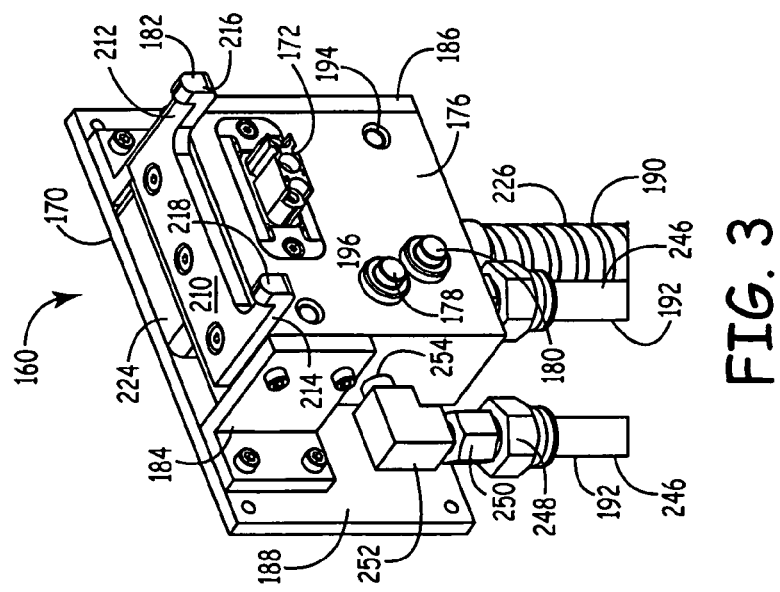

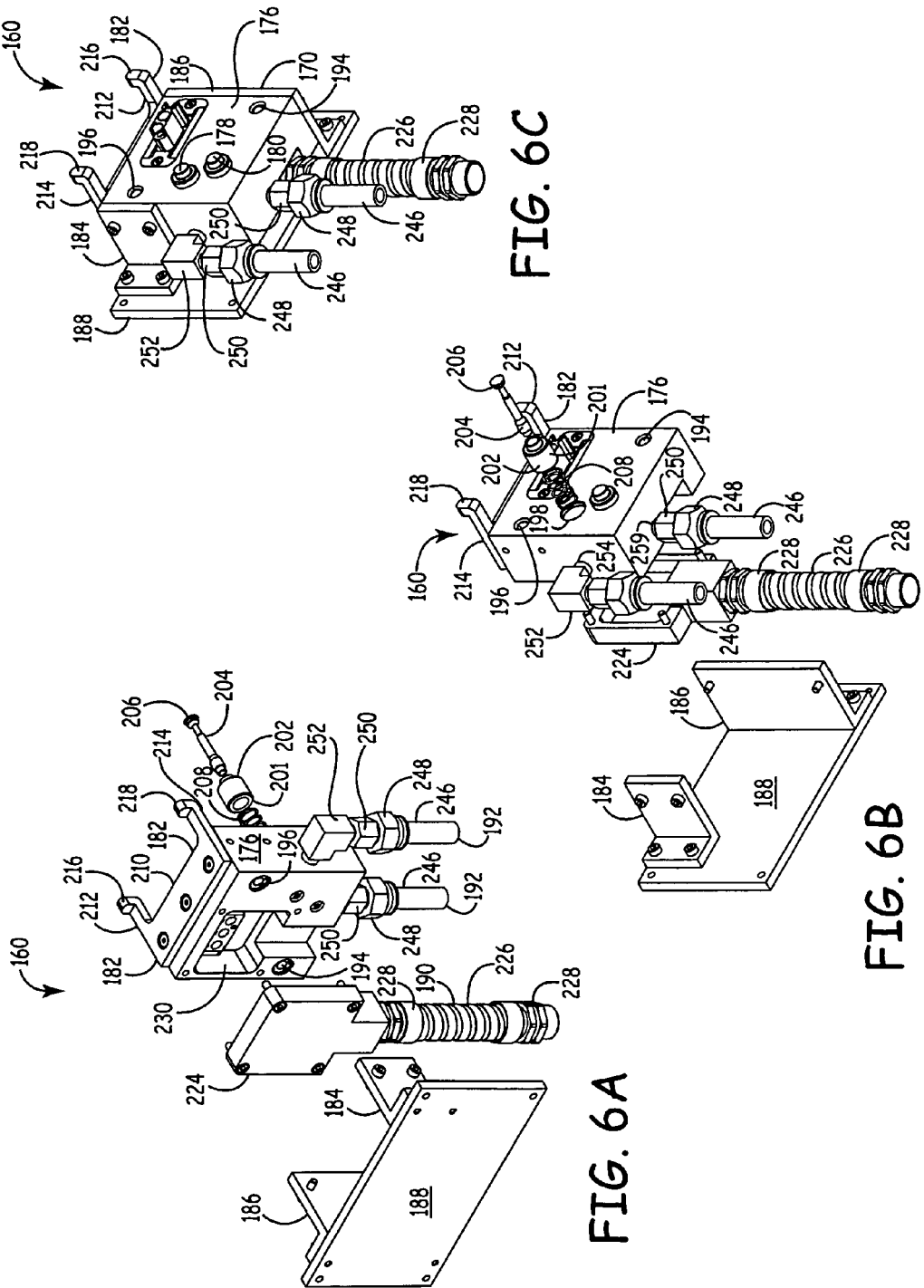

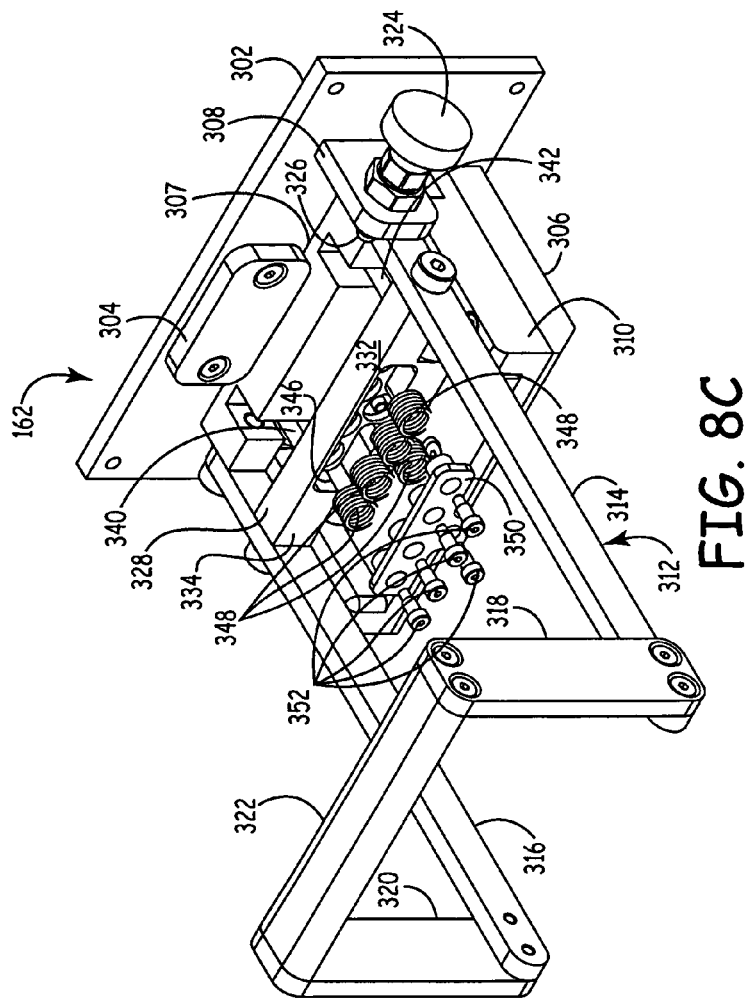
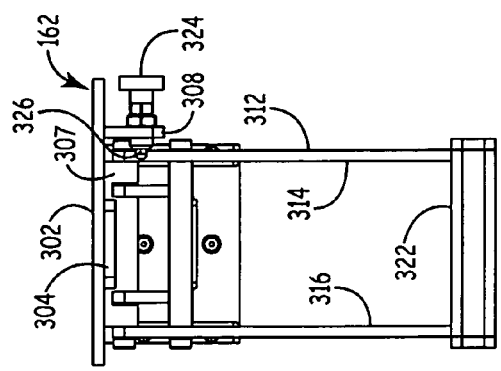
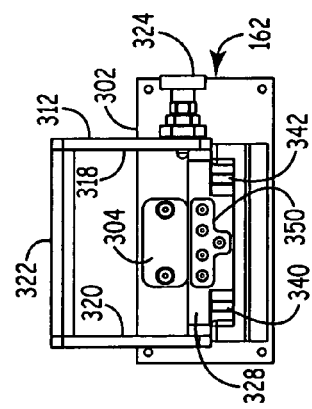

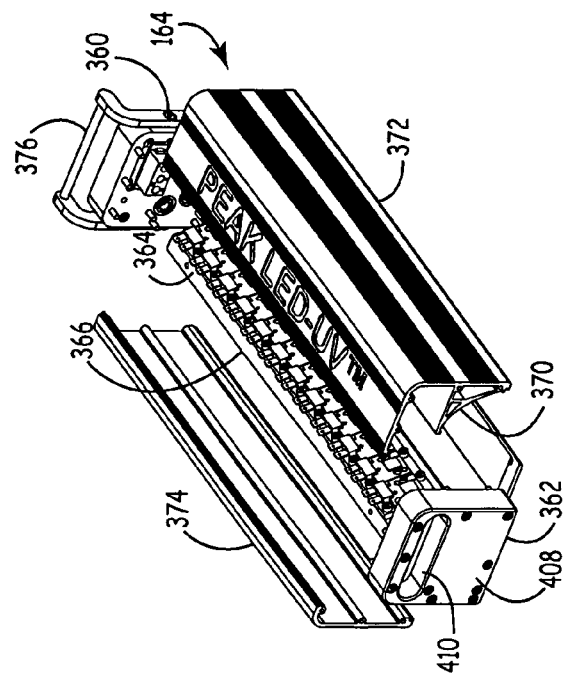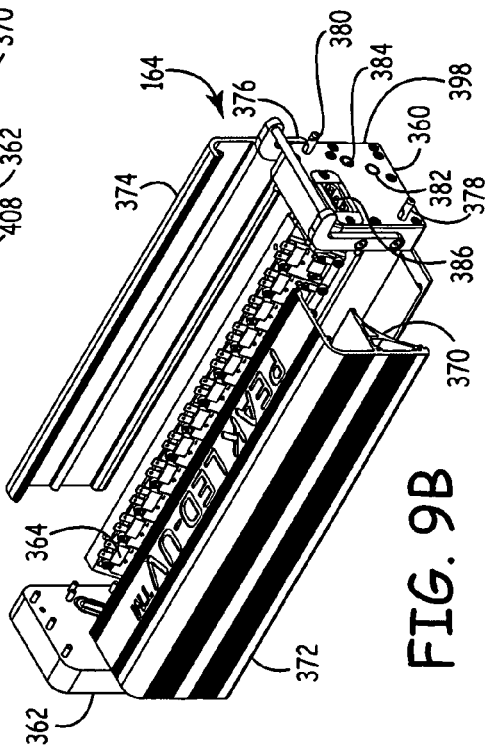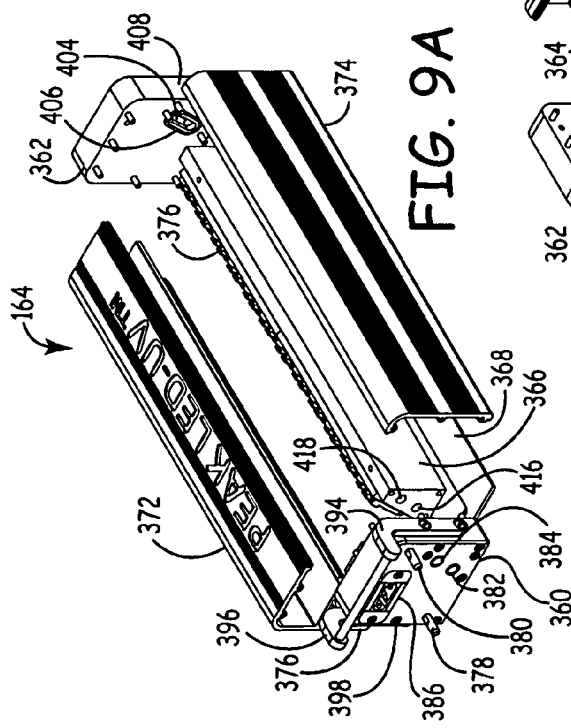

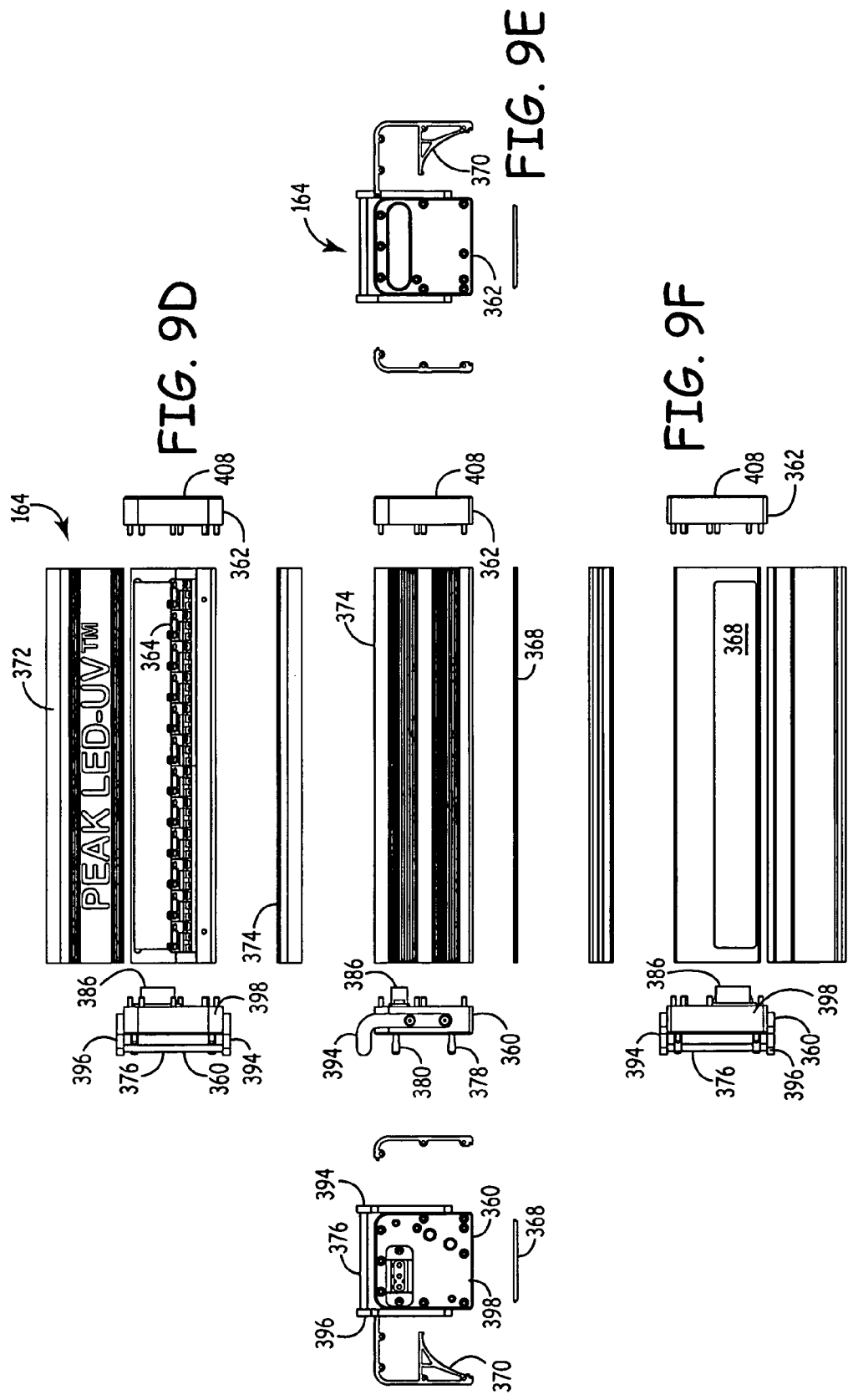

INTERCHANGEABLE UV LED CURING SYSTEM

CROSS-REFERENCES TO RELATED APPLICATIONS

This application claims priority under 35 U.S.C. §119(e) to, and hereby incorporates by reference, U.S. Provisional Application No. 61/237,436, filed 27 Aug. 2009, U.S. Provisional Application No. 61/237,455, filed 27 Aug. 2009, and U.S. Provisional Application No. 61/267,021, filed 5 Dec. 2009.

BACKGROUND OF THE INVENTION

1. Field of the Invention

The present invention relates to a method for the design and integration of a UV LED curing system suitable for a multi-station UV-curing process for UV-curable inks, coatings, and adhesives having UV photoinitiators therein.

2. Background

UV LED lamps are permanently mounted at each critical point within the UV-curing process. A critical point at which a UV LED lamp can be mounted will typically be downstream or just after the point where the UV-curable ink, coating, or adhesive has been applied to the substrate upon which it is to be cured. In a multi-station UV curing process, there are multiple critical points within the apparatus or process. These UV-LED lamps require regular cleaning and occasional maintenance.

Installation and removal of UV LED lamps as employed above is difficult and time consuming. Accordingly, installation and removal of UV LED lamps makes cleaning these lamps difficult because the lamp must be either removed and cleaned or cleaned while still in place in the system. If a UV LED lamp fails, it is again difficult and time-consuming to remove and replace, thereby usually causing excessive downtime. UV LED lamps may also interfere with cleaning and other maintenance tasks associated with the UV-curing process.

There is then a need for a way to change or repair irradiation sources such as UV LED lamps in such an apparatus.

SUMMARY OF THE INVENTION

Docking ports for the UV LED lamps may be permanently installed at various critical points within the UV-curing process. Docking ports enable the UV LED lamps to be easily inserted and removed from different points within the UV-curing process. This gives the user the option to have docking ports installed at every critical point within the UV-curing process, but to nonetheless purchase fewer UV LED lamps. UV LED lamps are costly and will be much more expensive than docking ports. The user could thusly save a significant amount of money by not being required to purchase a UV LED lamp for every critical point within the UV curing process, but by installing a docking port at each desired critical point they will then have the option to place a UV LED lamp at whichever critical point they desire and to move the UV LED lamps from one critical point to another as needed.

Docking ports for the UV LED lamps may also incorporate moveable, interchangeable plug assemblies that mate to the connection interface of the UV LED lamp. The housing for such a plug assembly may include an industrial connector incorporating the interface for electrical, communications, water and the like, as well with a mounting frame and locking levers that attach to the UV LED lamp without the use of tools. Using a movable, interchangeable plug assembly to mate to the connection interface of the UV LED lamp provides an additional option for making the power, communications, and water connections resulting in increased versatility in the method of installation onto the UV curing process.

A plurality of permanently installed docking ports and moveable plug assemblies may be installed at various positions within the same UV curing process. Both methods of docking are interchangeable and accommodate the same UV LED lamp depending on the location desired in the process. Being able to use several methods of docking within the same UV curing process may enable the UV LED lamps to be installed onto processes that may otherwise not be possible.

Docking ports of this invention are designed such that, when empty (i.e. the UV LED lamp has been removed), they are not obstructive to the various non-UV-curing tasks of the UV-curing process. For example, the docking port would be installed into an offset printing press in such a manner and position that, when the docking port is empty, the empty docking port does not inhibit or restrict the tasks of changing blankets or plates, cleaning the impression cylinder, adjusting sheet guides, or the like. Designing the docking ports such that they do not obstruct the performance of non-UV-curing tasks of the UV-curing process would allow the user to perform said tasks quickly and easily, as though the UV-curing system was not there.

The instant docking ports may be designed such that they accommodate UV LED lamps of differing input power requirements. For example and not by way of limitation, a UV LED lamp wherein the LEDs are of the 365 nm type would have different voltage and/or current requirements than a UV LED lamp wherein the LEDs are of the 385 nm type; the docking ports could be designed to accept and power of either of the UV LED lamps. Different UV-curable inks, coatings, and adhesives can have different conditions under which they cure. Designing the docking ports such that they can accommodate UV LED lamps with different input power requirements would accordingly enable the user to choose different UV LED lamps depending upon the curing application. This may allow the user to perform UV-curing applications that would not otherwise be possible.

Multiple docking ports may be at all or some of the critical points within the UV-curing process. Multiple docking ports may enable the user to quickly increase the UV energy available at a particular point within the UV-curing process by inserting multiple UV LED lamps. Multiple docking ports would also enable the user to apply multiple wavelengths of UV light at a particular point within the UV-curing process by inserting lamps of different wavelength output. This may allow the user to perform UV-curing applications that would not otherwise be possible.

The UV LED lamps may be designed so as to be interchangeable, which means that any UV LED lamp can be easily inserted into and removed from any of the provided docking ports that are permanently installed at various points within the UV-curing process. By designing the UV LED lamps such that they are interchangeable, any UV LED lamp can be inserted into or removed from any docking port within the UV-curing process. The user can place the UV LED lamps into the docking ports that each particular application would require, making the overall system more flexible. The interchangeability of the UV LED lamps could enable the user to exchange lamps between multiple identical UV-curing processes. The interchangeability of the UV LED lamps creates flexibility in the UV-curing system that could save the user a significant amount of money.

The UV LED lamps of this invention could be designed to incorporate an optical design consisting of parabolic or elliptical trough reflectors to direct the UV light emitted by the LEDs onto the substrate to be cured in a controlled manner that maximizes the irradiance and energy density delivered to the substrate. By designing these interchangeable UV LED lamps such that they incorporate a common optical design using a parabolic or elliptical trough reflector, these UV LED lamps can be located at varying distances and mounting locations with respect to the substrate being cured without a significant loss of uniformity or optical (irradiant) intensity.

The UV LED lamps and their associated docking ports may be designed such that the insertion of the UV LED lamp into the docking port, and the removal of the UV LED lamp from the docking port is a quick and tool-less procedure. For example, when a UV LED lamp is inserted into a docking port, a latch mechanism may secure the UV LED lamp into its correct operating position. Then, when it is desired to remove the UV LED lamp, the latch mechanism could be released by the push of a button, or the twist or pull of a lever, or the like. The ability to quickly insert a UV LED lamp into, or remove it from, a docking port makes the overall operation of the UV-curing system much more convenient for the user as well as demanding much less of the user's time. The tool-less design reduces the incidence in which tools and/or fasteners are dropped into the UV-curing process during the insertion or removal procedure. Dropping such an item can consume large amounts of time because the item must be found or, significant, possibly catastrophic damage can be caused to the UV-curing process if the dropped item is not removed.

The UV LED lamps and their associated docking ports are to be designed such that all necessary connections (e.g. electrical, water, communications, or the like) are engaged automatically when the UV LED lamp is inserted into a docking port. The connections are then automatically disengaged when the UV LED lamp is removed from the docking port. No process or procedure is required to engage or disengage the connections between the UV LED lamp and the docking port that is in addition to that required to install the UV LED lamp into, or remove the UV LED lamp from, a docking port. Automatic engaging and disengaging of the connections between the UV LED lamp and the docking port upon insertion and removal of the UV LED lamp ensure that the connections are made properly, and save time and make the overall operation of the UV-curing system more convenient for the user.

Accordingly, a docking port for securing a lamp emitting radiation toward a substrate in a printing press is provided. The docking port may include a connection portion and a cradle portion. The connection portion may have fluid and electrical connectors mating corresponding fluid and electrical connectors in the lamp. The cradle portion may have a cradle accommodating a portion of the lamp and a latch arm assembly securing the lamp into the cradle and against the connection portion. The latch arm assembly may be pivotable between an open position in which the lamp can be removed from or inserted into the docking port and a closed position in which the lamp is secured to the docking port.

A docking port for securing a lamp emitting radiation toward a substrate in a printing press may be provided. The docking port may include a connection portion and a cradle portion. The connection portion may include means for aligning electrical and fluid components present in the lamp. The cradle portion may have a cradle accommodating the lamp, a pivotable latch arm assembly, and a push plate mounted to the latch arm assembly. The latch arm assembly may secure the lamp in the cradle and the push plate may be biased against the lamp connection portion.

A method of curing an ink, a coating, or an adhesive deposited on a substrate traveling a path through a printing press is provided. The method may include directing UV radiation at the ink, coating, or adhesive when the ink, coating, or adhesive is present in a critical location within the printing press. The UV radiation may be emitted from lamp secured in a docking port mounted to the printing press. The docking port may include a connection portion and a cradle/latch portion. The connection portion may have an alignment hole and may provide coolant and electricity to the lamp. The alignment hole may align with an aligning pin present on the lamp when the lamp is secured in the docking port. The cradle/latch portion may have a cradle and an arm assembly. The arm assembly secures the lamp in the cradle and against the connection portion.

A method of attaching a docking port to a printing press is provided. The docking port may include a connection portion and a cradle/latch portion. The method may include mounting the connection portion and latch portion such that a lamp can be secured into the docking port, such that the lamp directs UV radiation at a critical location, and a such that a cradle arm assembly of the cradle/latch portion biases the lamp against the connection portion.

BRIEF DESCRIPTION OF THE DRAWINGS

FIG. 3 is a perspective view of one embodiment of a connection portion of the docking port of this invention.

FIG. 4 is a perspective view of one embodiment of a cradle/latch portion of the docking port this invention.

FIG. 6A is an exploded view of the connection portion of FIG. 3.

FIG. 6B is another exploded view of the connection portion of FIG. 3.

FIG. 6C is yet another exploded view of the connection portion of FIG. 3.

FIG. 8A is a plan view of the cradle/latch portion of FIG. 4.

FIG. 8B is a front view of the cradle/latch portion of FIG. 4.

FIG. 8C is a partially exploded, perspective view of the cradle/latch portion of FIG. 4.

FIG. 9A is a perspective, exploded view of the UV LED lamp of FIG. 5.

FIG. 9B is another perspective, exploded view of the UV LED lamp of FIG. 5.

FIG. 9C is yet another perspective, exploded view of the UV LED lamp of FIG. 5.

FIG. 9D is a top, exploded view of the UV LED lamp of FIG. 5.

FIG. 9E is a side, exploded view of the UV LED lamp of FIG. 5.

FIG. 9F is a bottom, exploded view of the UV LED lamp of FIG. 5.

It is understood that the above-described figures are only illustrative of the present invention and are not contemplated to limit the scope thereof.

DETAILED DESCRIPTION

Comprehension of this invention can be gained through reference to the drawings in conjunction with a thorough review of the following explanation. Any references to such relative terms as front and back, top and bottom, upper and lower, or the like, are intended for convenience of description and are not intended to limit the present invention or its components to any specific positional or spatial orientation. Dimensions of the components in the attached figures may vary with a potential design and the intended use of an embodiment of the invention without departing from the scope of the invention.

The following is a description of the design and implementation of the UV LED curing system disclosed herein. For clarity, sheet-fed offset printing will be used as an example of a UV-curing process in which the UV LED curing system can be applied. The following examples and figures are intended to teach a person skilled in the art how to effectively design, manufacture, and practice the present invention, but are not intended to limit the scope of the invention. The features and methods disclosed in the detailed description may be used separately or in conjunction with other features and methods to provide improved devices of the invention and methods for making the same. The features and methods disclosed in this detailed description may not be necessary to practice the invention in the broadest sense, but are provided so that a person of skill in the art may further understand the details of the invention.

Figure 1B:
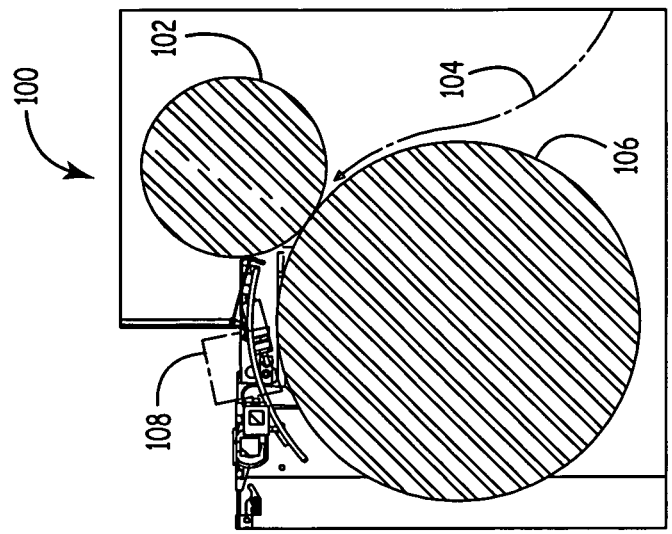
FIG. 1B is a cross sectional view of the sheet-fed offset printing press of FIG. 1A along line A-A.
Figure 1A:
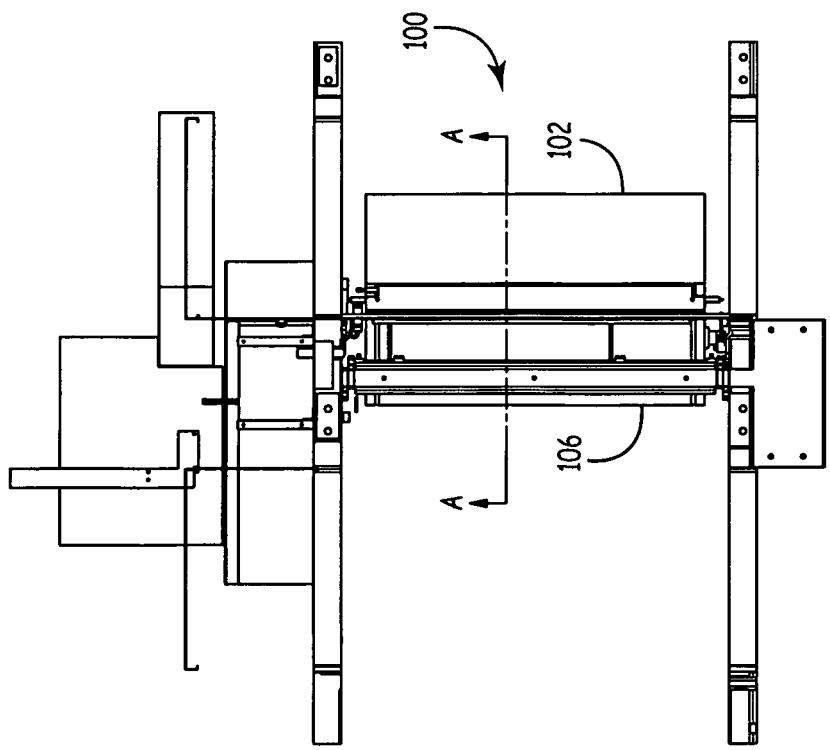
FIG. 1A is a plan view of a sheet-fed offset printing press of this invention.

Referring to FIGS. 1A, 1B, a sheet-fed offset printing system is indicated generally at 100. When the sheet-fed offset printing system 100 is operating, a UV-curable material, e.g., ink, coating, is metered onto a blanket cylinder 102, from which the UV-curable material is transferred onto a substrate, such as paper, board stock, or plastic. Within the exemplary sheet-fed offset printing system 100, the substrate travels along a path 104. Transfer of the UV-curable material from the blanket cylinder 102 onto the substrate occurs when the substrate is rolled between the blanket cylinder 102 and an impression cylinder 106. FIGS. 1A and 1B show an exemplary critical point or location 108 at a position suitable for directing UV radiation (energy) at the UV-curable material which has been transferred onto the substrate.

Figure 2:
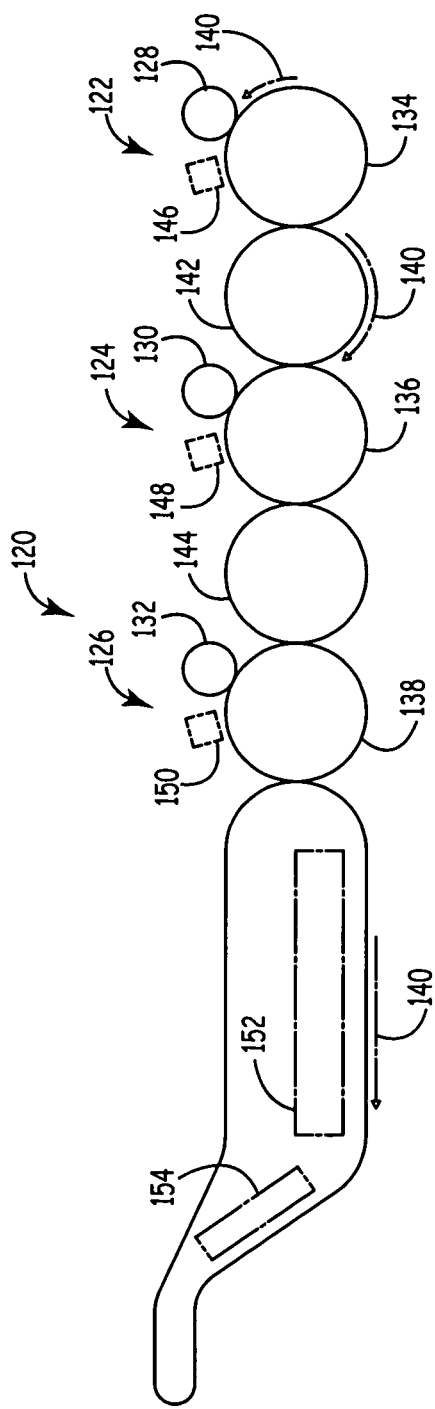
FIG. 2 is a side of a multi-station sheet-fed offset printing press.

In practice, the sheet-fed offset printing system 100 may be a component of a multi-station printing system 120, as depicted in FIG. 2. In FIG. 2, a plurality of, e.g., three, sheet-fed printing systems 122, 124, 126 are present and include respective blanket cylinders 128, 130, 132 and impression cylinders 134, 136, 138. In the exemplary multi-station printing system 120, the substrate is conveyed along path 140. Along the path 140, the substrate is transferred from system 122 to system 124 by a transfer cylinder 142 and from system 124 to system 126 by a transfer cylinder 144. In each of these systems 122, 124, 126, a plurality of different UV-curable products, such as coatings or differing color inks, may be applied in succession. Consequently, a critical point or location 146, 148, 150 is present in each of the respective systems 122, 124, 126. Additional, optional critical points may be present at an end of press portion 152 and an upsweep portion 154. In each of the printing systems 122, 124, 126, the UV-curable product is applied to a blanket cylinder 128, 130, 132 and transferred to the substrate where the substrate is rolled between the blanket cylinder 128, 130, 132 and the respective, corresponding impression cylinder 134, 136, 138. The UV-curable product is then cured by UV radiation at a corresponding, respective critical point 146, 148, 150.

Figure 5:
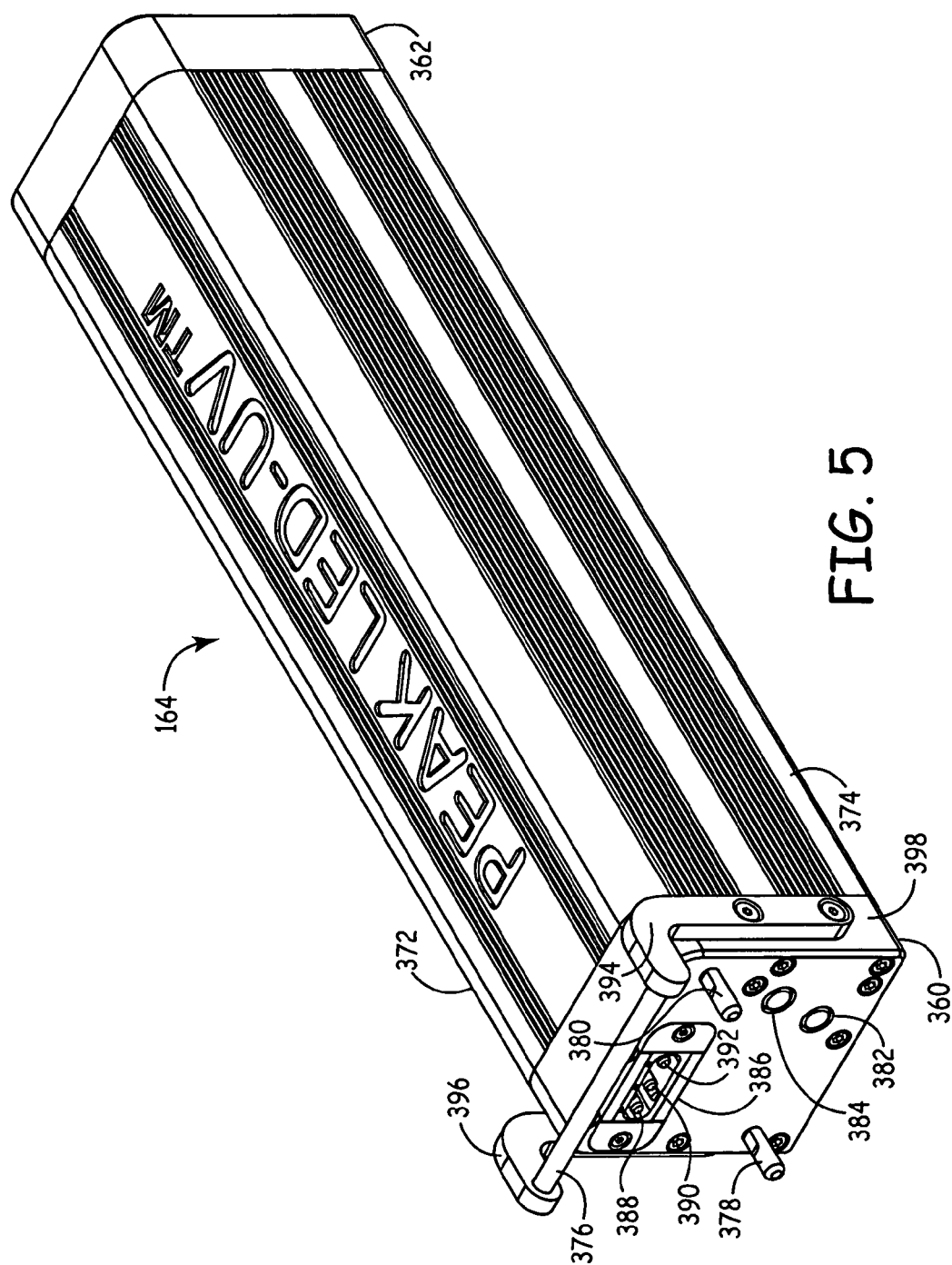
FIG. 5 is a perspective view of one embodiment of a UV LED lamp of this invention.
Figure 7A:
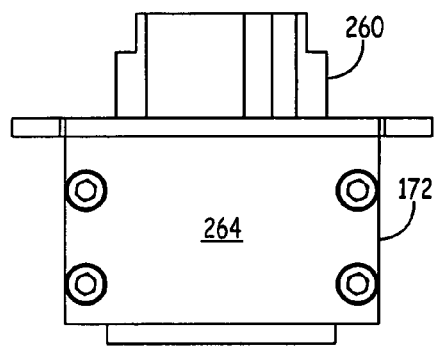
FIG. 7A is a side view of one embodiment of a female electrical block of this invention.
Figure 7C:
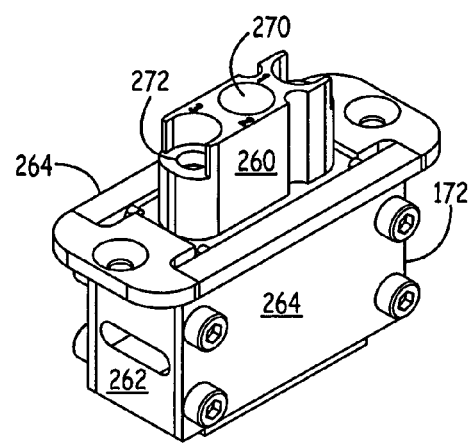
FIG. 7C is a perspective view of the female electrical block of FIG. 7A.
Figure 7B:
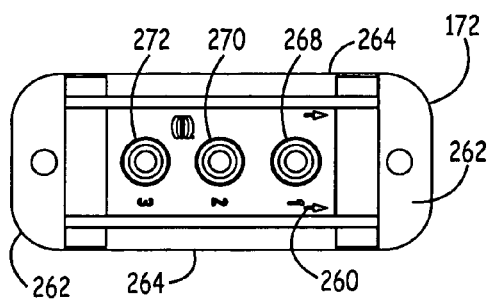
FIG. 7B is a plan view of the female electrical block of FIG. 7A.

Referring to FIGS. 3, 4, 5, one embodiment of the invention is providing docking port portions 160, 162, which may be permanently mounted at any of the critical points 108, 146, 148, 150, 152, 154 of this invention. Together the docking port portions 160, 162 comprise a docking port 90 of this invention as shown in FIGS. 10A, 10B, 11A, 11B, 12A, 12B. Referring again to FIGS. 3, 4, 5, in the embodiment depicted, docking port portion 160 is a connection portion and docking port portion 162 is a cradle/latch portion. The docking portions 160, 162 accordingly provide a means whereby a UV LED lamp 164 can be quickly installed or removed. While the docking portions 160, 162 may differ in form between different critical points 108, 146, 148, 150, 152, 154, the docking portions 160, 162 may be similar or substantially identical in function. As such, the UV LED lamp 164 can be installed onto any specific combination of the docking portions 160, 162. In one embodiment, the docking portions 160, 162 are low profile and, hence, would not inhibit other non-UV-curing tasks associated with the UV-curing process. Such tasks include cleaning, maintenance, and the like.

FIG. 3 depicts one embodiment of a docking or connection portion 160, which is a docking port of the present invention. At connection portion 160, power, communications, coolant (e.g., water) supply and the like are provided to the UV LED lamp 164 when the UV LED lamp 164 is attached as will be more fully described hereinbelow. Referring now to FIGS. 3, 6A, 6B, 6C, 7A, 7B, 7C, an exemplary structure of the instant connection portion 160 is depicted and includes an LED connection block 170, which may house a female electrical block 172. The LED connection block 170, in turn, has a housing 176, fluid valves 178, 180, a latch bar guide 182, respective short and long mount brackets 184, 186, a mount plate 188, and respective electrical and fluid supply assemblies 190, 192. Alignment holes 194, 196 are defined in the housing 176 and the valves 178, 180 are accommodated by valve bores 198, 200 (valve bore 200 not shown). As best viewed in FIG. 6A, a linear bearing 232 (not shown) is retained in the rear portion of each alignment hole 194, 196 by a retaining ring 234 (not shown). The instant alignment holes 194, 196 serve to align coolant and power connections with the instant LED lamp to thereby avoid misalignment during connection and possible damage resulting from misalignment. Each linear bearing 232 facilitates a guide pin present in the LED lamp of this invention during insertion and removal, serving to keep the guide pins from binding in the alignment holes. Each of the exemplary valves 178, 180 may be a valve assembly 201, which includes a valve sleeve 202 accommodating a valve stem 204, and an O-ring 206 providing a seal between the valve sleeve 202 and valve stem 204. Another O-ring (not shown) provides a seal between the valve sleeve 202 and the interior surface of each of the valve bores 198, 200. A valve spring 208 biases each of the valves 178, 180 in a closed, sealing position. The latch bar guide 182, in the embodiment shown, includes unitary, or otherwise integral, plate 210 and prongs 212, 214 extending from the plate 210. Each of the prongs 212, 214 terminates in a respective tip 216, 218. The tips 216, 218 extend above a continuous, planar upper surface of the plate 210 and prongs 212, 214. The short and long mount brackets 184, 186 attach to the mount plate 188 and to opposing sides of the housing 176. The electrical supply assembly 190 includes an electrical cover 224, a conduit 226, and one or more swivel fittings 228. Either the conduit 226 or a swivel fitting 228 attaches to a basal portion of the electrical cover 224. The swivel fittings 228 allow rotation to occur without strain or torsion being applied to the conduit 226 or to the electrical cover 224 during maintenance and replacement operations. When the conduit 226 and/or swivel fitting 228 is attached to the electrical cover 224, the electrical cover 224 then attaches to the housing 176, wherein the electrical cover 224 is accommodated within a recess 230. The fluid supply assembly 192, in the embodiment disclosed and depicted, supplies a cooling fluid, such as water, to each of the valves 178, 180 by means of a pair of tubings 246, each tubing 246 being coupled to an adapter 248. Each adapter 248, in turn, is attached to a reducer 250. In one case, the reducer 250 is attached to an elbow 252, which attaches to a nipple 254. The nipple 254 couples to the housing 176, thereby ingressing and egressing coolant through pathways formed in the housing between the nipples 254 and valve 178, 180. In one embodiment the valves 178, 180 are poppet-style valves to minimize drip and leakage when disengaged.

Referring now to FIGS. 3, 7A, 7B, 7C, the female electrical block 172 has a three-pin female contact module 260 secured between a pair of electrical block bolt plates 262 and a pair of electrical block side plates 264. The electrical block bolt plates 262 and electrical block side plates 264, when attached together, form a housing within which the three-pin female contact module 260 is secured. The three-pin female contact module 360 defines three holes 268, 270, 272, which accommodate pins present in the UV LED lamp 164 and described in greater detail hereinbelow.

Figure 8D:
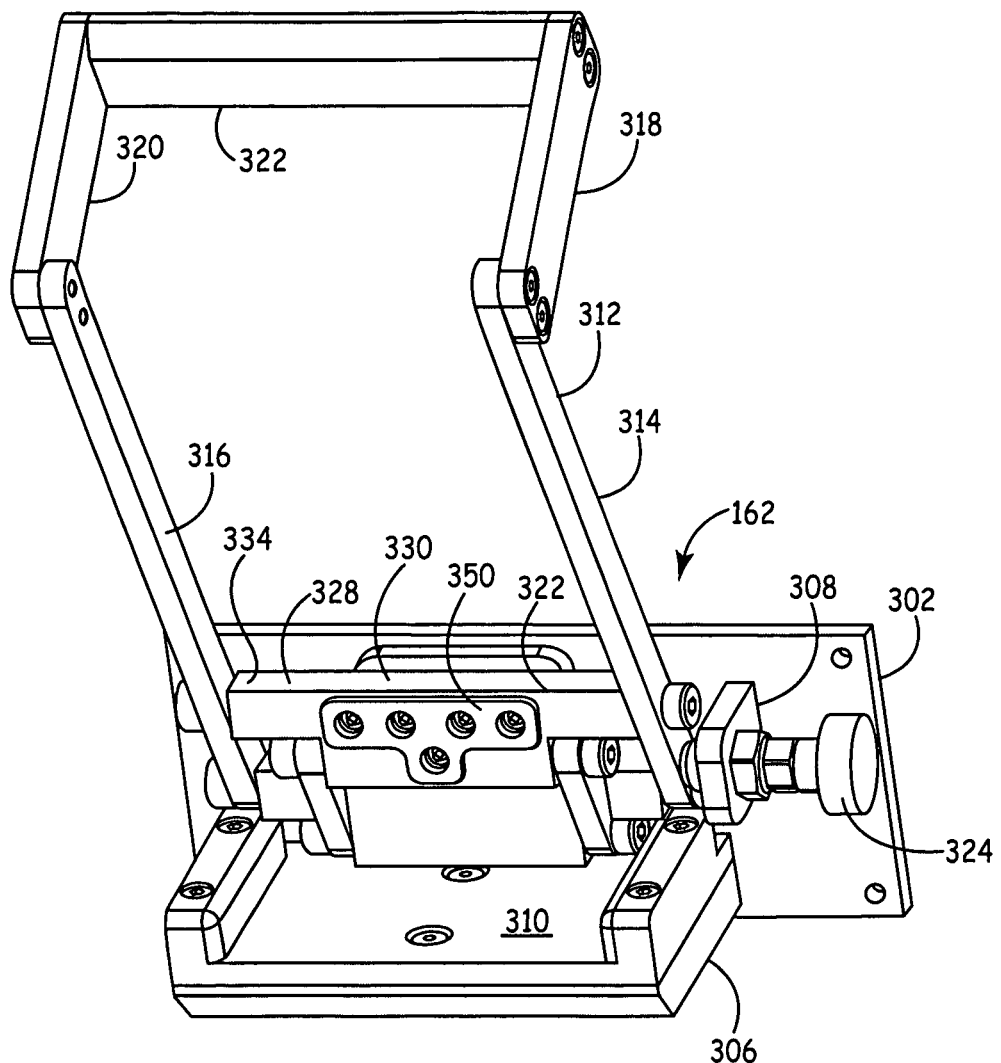
FIG. 8D is a front view of the cradle/latch portion of FIG. 4 in an intermediate position.
Figure 8E:
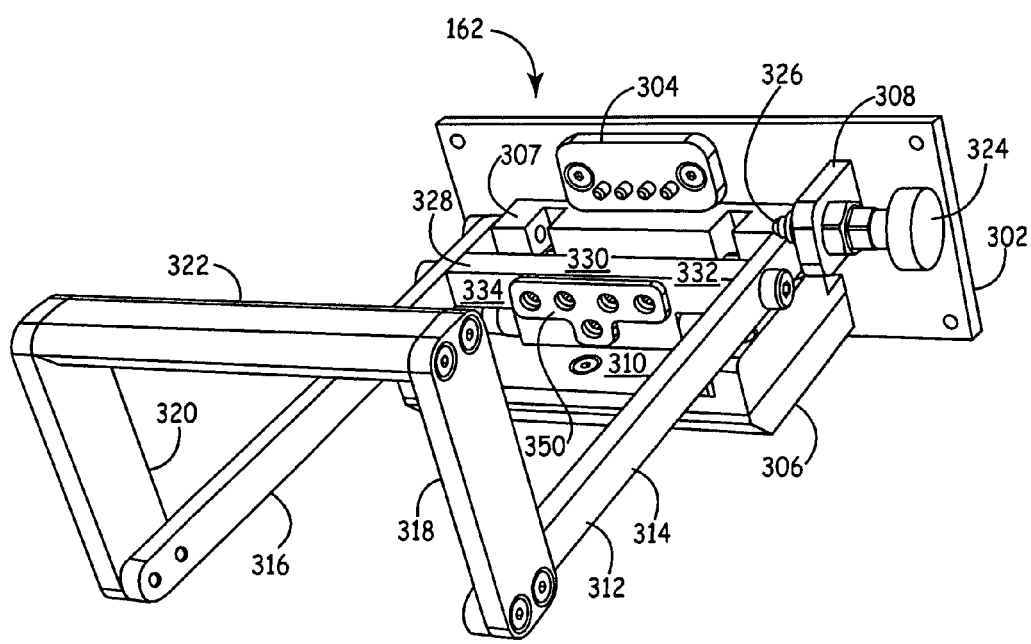
FIG. 8E is a front view of the cradle/latch portion of FIG. 4 in a lowered position.
Figure 8F:
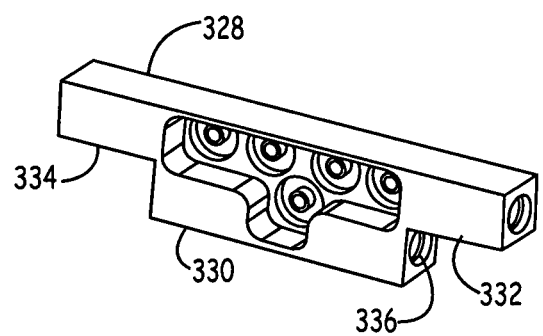
FIG. 8F is a perspective view of one embodiment of a push plate of this invention.

The docking port embodiment of the cradle/latch portion 162 is depicted in FIGS. 4, 8A, 8B, 8C, 8D, 8E. The cradle/latch portion 162 has a latch mount plate 302 to which a latch stop pad 304, a cradle mount plate 306, a pivot plate 307, and a latch mount block 308 are directly attached. A cradle 310 is affixed to an upper surface of the cradle mount plate 306. Pivotally attached to the latch mount block 308 is a latch arm assembly 312. With respect to the latch arm assembly 312, latch arms 314, 316 are pivotally connected to, and extend from, the latch mount block 308. Latch handle arms 318, 320 orthogonally, or otherwise transversely, extend from ends of the respective latch arms 314, 360. A latch handle 322 is affixed to, and spans between, the latch handle arms 318, 320. A spring mount plunger 324 is affixed to, and extends through, the latch mount block 308. An internal spring (not shown) biases the spring mount plunger 324 such that a plunger pin 326 extends so as to abut an upper surface of the latch arm 314 to retain the cradle/latch portion 162 in the position or configuration depicted in FIGS. 8A, 8B, 8C. A push plate 328 is pivotally affixed to, and extends between the latch arms 314, 316. Referring to FIG. 8F, the push plate 328 has a central portion 330 and extensions 332, 334. Mounting bores 336, 338 (mounting bore 338 not shown) are formed in, and extend inboard from, outboard surfaces of the central portion 330. Linkages 340, 342 extend between the pivot plate 307 and the push plate 328, such linkages 340, 342 being attached to the push plate 338 by extending connectors through the linkages 340, 342 and into the mounting bores 336, 338. Accordingly, the linkages 340, 342 function to orient the push plate 328 such that the push plate 328 faces toward the opening of the latch arm assembly 312 as shown in FIG. 8C when the latch arm assembly 312 is in a closed position as depicted in FIG. 8C. The linkages 340, 342 also orient the push plate 328, such that the push plate 328 faces orthogonally, or otherwise transversely, to the latch arm assembly 312, as shown in FIG. 4. A cavity 346 formed in the push plate 328 accommodates a plurality of, e.g., five, push springs 348, the push springs 348 being retained and biased within the cavity 346 by a push pad 350. The push pad 350 may be secured to the push plate 328 by a plurality of connectors 352.

One embodiment of a UV LED lamp, which can be utilized with the instant invention, is shown in FIGS. 5, 9A, 9B, 9C, 9D, 9E, 9F at 164. Another description of the lamp of this invention is present in co-pending U.S. patent application Ser. No. 12/868,846, and filed concurrently with this application, hereby incorporated by reference. The embodiment of the lamp 164, as shown, includes a connection endcap 360, a crossover endcap 362, an LED segment 364, a heat sink 366, an A/R glass 368, and a reflector 370. The LED segment 364 and heat sink 366 may be enclosed within module body portions 372, 374. It is contemplated that the instant lamp 164 may output UV radiation of any specific wavelength or desired combination of wavelengths.

The connection endcap 360, in turn, has an alignment bar 376, alignment pins 378, 380, coolant ports 382, 384 and an electrical connector 386. Electrical pins 388, 390, 392 may be present in the electrical connector 386 and may mate with holes 268, 270, 272 in the female electrical block 172 of the connection portion 160. The alignment bar 376 may be mounted between alignment bar brackets 394, 396, the alignment bar brackets 394, 396 secured to the connection endcap body 398. The alignment bar is dimensioned and positioned to be retained by the latch bar guide 182 on the upper surface of the prongs 212, 214 and behind the raised tips 216, 218. The crossover endcap 362, in turn, has a coolant crossover opening 404, which may be sealed by a crossover O-ring 406, the crossover O-ring 406 attached to a crossover endcap body 408. A cavity 410 is formed in an opposite face of the crossover endcap body 408. The cavity 410 is dimensioned and disposed so as to accommodate all or a portion of the push plate 328 of the cradle/latch portion 162. A plurality of, e.g., two, LED segments 364 each containing six LEDs may be attached to the heat sink 366. As stated before, the LED segments may output a single wavelength or range of wavelengths or may output a combination of wavelengths or ranges of wavelengths. The heat sink 366 defines a plurality of, e.g., two, coolant tunnels 416, 418. One of the coolant tunnels 416, 418 receives coolant by means of one of the coolant ports 382, 384 of the connection endcap 360. At the other end of the heat sink 366, the coolant tunnels 416, 418 are positioned and dimensioned so as to open into the crossover opening 404, so that coolant egressing from one of the coolant tunnels 416, 418 ingresses into the other of the coolant tunnels 416, 419. The crossover O-ring 406 forms a seal between the crossover endcap 360 and the heat sink 366. Individual O-rings (not shown) or equivalents may be utilized to form seals between the connection endcap 360 and the heat sink 366 proximate the coolant ports 382, 384. In one embodiment, the coolant tunnels 416, 418 are dimensioned and located such that a minimum temperature gradient exists over the surface of the heat sink 366. Stated otherwise, the coolant tunnels 316, 318 are dimensioned and situated within the heat sink 366 such that an essentially constant average temperature is present at the heat sink 366 surface proximate where the LED segments 364 are attached thereto.

Herein, one embodiment of a connection portion 160 is depicted. At the connection portion 160, power, communications, coolant, and the like are communicated between the UV LED lamp 164 and the docking portions 160, 162 upon installation of the UV LED lamp 164 as described herein. The electrical connections may be pins 388, 390, 392 and sockets 268, 270, 272. The water or coolant connections 178, 180 may be poppet-style valves to minimize leakage and drip when disengaged. In one embodiment, the connection portion 160 defines alignment holes 194, 196 to accommodate alignment pins 378, 380 contained in the connection endcap 360 of the UV LED lamp 164. The connection portion 160 may support the connection endcap 360 of the UV LED lamp 164. The connection portion 160 may contain an alignment hook or plate such as the latch bar guide 182 to thereby aid in the alignment of the connection endcap 360 as the UV LED lamp 164 is being installed and to also aid in supporting the instant UV LED lamp 164 when the UV LED lamp 164 is an unlatched state during installation or removal. The connection portion 160 may also contain features such as bolt holes for mounting into a printing press assembly.

Figure 10A:
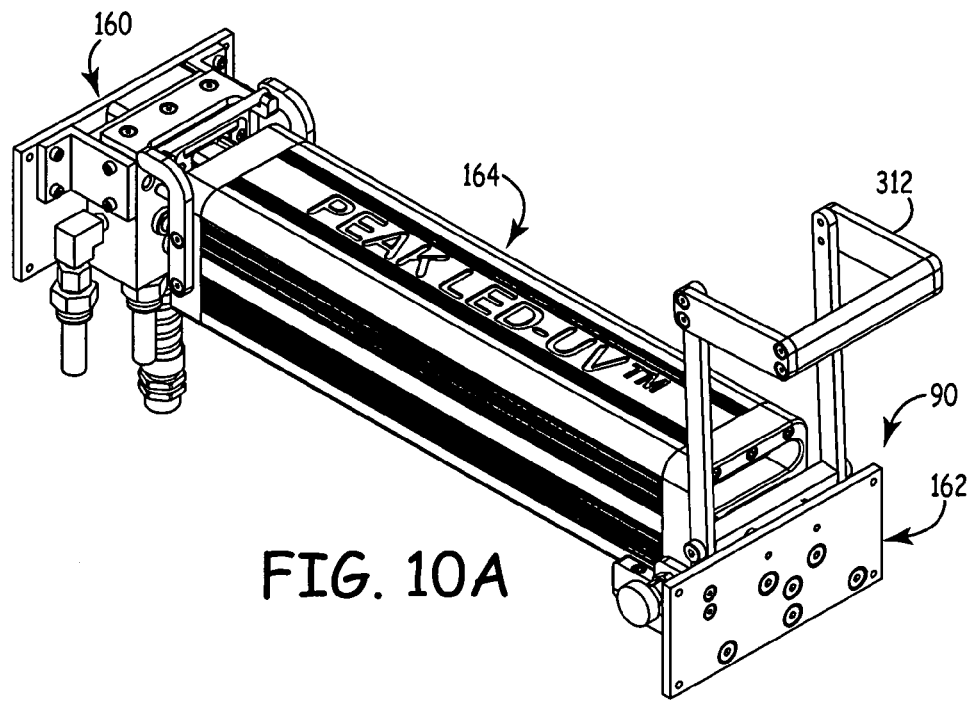
FIG. 10A is a perspective view of the instant docking port and UV LED lamp in a raised position.
Figure 10B:
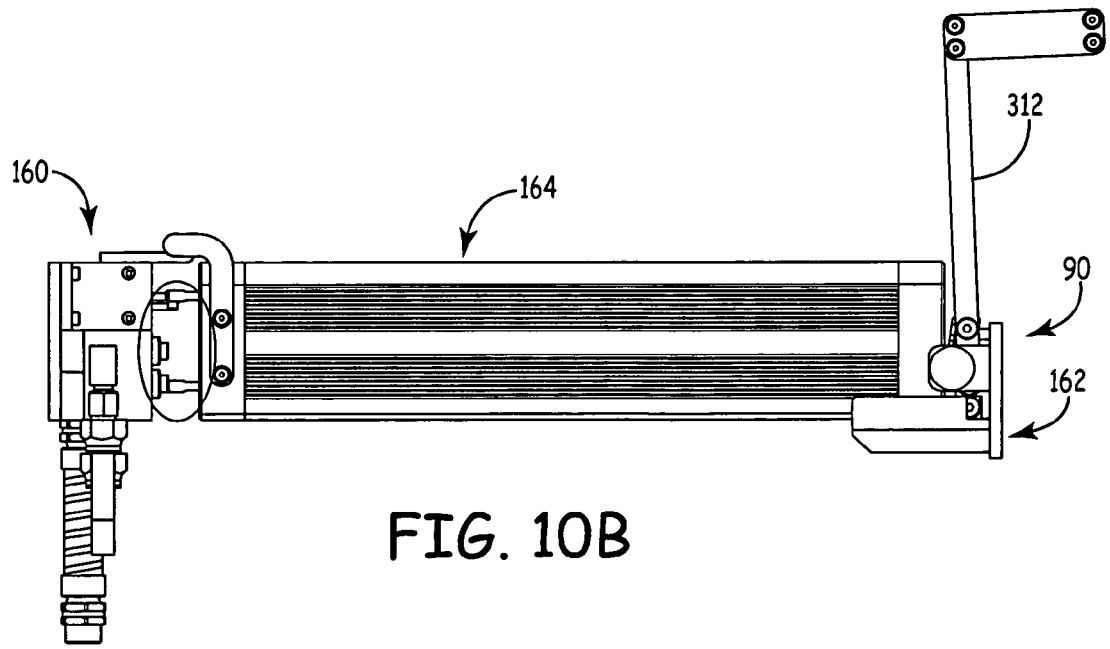
FIG. 10B is a side view of the instant docking port and UV LED lamp of FIG. 10A.

In one embodiment, the cradle/latch portion 162 provides support for the UV LED lamp 164 proximate the crossover endcap 362. The cradle/latch portion 162 also provides a means whereby the UV LED lamp 164 may be quickly and securely mounted into the UV-curing process in a manner ensuring that fluid and electrical connections are fully and properly made between the docking portions 160, 162 and the UV LED lamp 164. The cradle/latch portion 162 may contain a cradle 310 to support the UV LED lamp 164, e.g., opposite the connection end 132. The cradle/latch portion 162 may also contain a latch lever such as the latch arm assembly 312, which can be raised and lowered by the operator. As shown in FIGS. 10A, 10B, the latch lever 312 is shown in an up or open position. The latch lever 312 must be in this up or open position in order to remove or install the instant UV LED lamp 164 into or out of the docking ports 160, 162. The UV LED lamp 164 is then secured into the docking ports 160, 162 by lowering the latch lever 312 through the intermediate position shown in FIGS. 11A, 11B and into the lowered or closed position depicted in FIGS. 12A, 12B. The cradle/latch portion 162 may further contain a push pad 288 attached such that when the latch lever 312 is lowered into the down or closed position of FIGS. 12A, 12B, the push pad 288 is displaced forward, thereby pushing the UV LED lamp 164 firmly against the connection portion 160 and ensuring that all connections between the UV LED lamp 164 and the docking portions 160, 162 are secure. When the latch lever 312 is in the down or closed position, both ends 360, 362 of the UV LED lamp 164 are securely supported such that the UV LED lamp 164 cannot accidentally fall out of the docking port or cannot be unintentionally removed from the docking port without first raising the latch lever 312 into the up or open position. The cradle/latch portion 162 may contain a locking pin 324, or other suitable locking mechanism, that would securely lock the latch lever 312 into the down or closed position, thereby preventing the latch lever 312 from being raised unintentionally. It may also be useful in certain embodiments for the locking mechanism or pin 324, or perhaps a second, additional locking mechanism, to be present to lock the latch lever 312 into the up or open position, such that the latch lever 312 stays in the up or open position until intentionally lowered. The cradle/latch portion 162 may also contain features such as bolt holes for mounting to the instant printing press.

In one embodiment of the instant UV LED lamp 164, such lamp fits into a docking port 90 as described herein. The UV LED lamp 164 may have a connection endcap 360, which mates with a connection portion 160 of the docking port 90 and an opposite endcap 362 resting in the cradle 310 of the cradle/latch portion 162. The connection endcap 360 may contain electrical pins 388, 390, 392 and water valves 382, 384 to transfer power, communications, and coolant (e.g., water) from the connection portion 160 to the UV LED lamp 164. The connection endcap 360 may also contain alignment pins 378, 380 which fit into mating aligning holes 194, 196 on the connection portion 160. Such pins and holes may ensure that the fluid and electrical connections are securely attained during engagement. The connection endcap 360 may also contain an alignment bar 376, which may mate with the alignment fork, alignment, hook, or latch bar guide 182 of the connection portion 160. The alignment bar 376 and alignment hook 182, along with a cradle 310, may support the UV LED lamp 164 as the UV LED lamp 164 rests in the docking port 90 with the latch lever 312 in the up or open position.

FIGS. 10A, 10B show the connection portion 160 and cradle/latch portion 162 of the docking port 90 as these portions 160, 162 would be in relation to each other when mounted to a UV-curing process. In such a relation, the latch lever 312 is in an up or open position. The locking pin 324 holds the latch lever 312 in the up or open position. In the up or open position, the UV LED lamp 164 can be freely placed onto, or removed from, the docking port 90, wherein the UV LED lamp 164 is supported loosely at each endcap 360, 362 and may be slid back and forth along its longitudinal axis between the connection portion 160 and cradle/latch portion 162 of the docking port 90 and with all fluid and electrical connections disengaged.

Figure 11A:
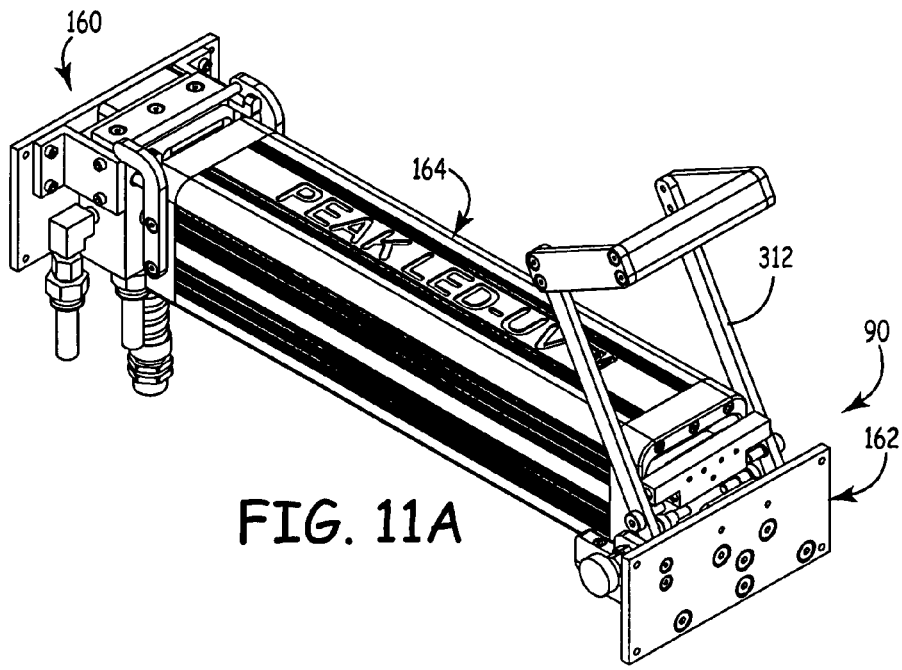
FIG. 11A is a perspective view of the instant docking port and UV LED lamp in an intermediate position.
Figure 11B:
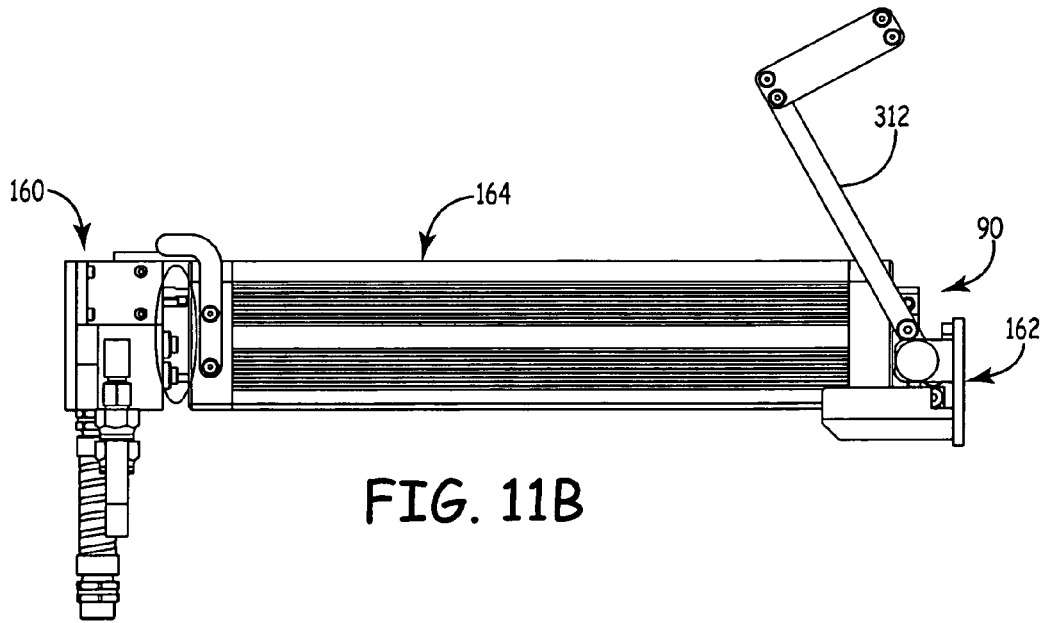
FIG. 11B is a side view of the instant docking port and the UV LED lamp of FIG. 11A.

FIGS. 11A, 11B depicted the docking port 160, 162 with the instant UV LED lamp module 164 in place with the latch lever 312 partially down in an intermediate position. To attain such an intermediate position, the locking pin 324 must be pulled to disengage or release the latch lever 312 before the latch lever 312 can be pushed into the position shown. As the latch lever 312 is pushed down, the push pad 288 is displaced forward into the cavity 410 of the crossover endcap 362, pushing the UV LED lamp 164 closer to the connection portion 160 of the docking port 90 of this invention. Alternatively, the push pad 288 abuts the outer surface of the crossover endcap 362 and the cavity 410 is used to grip the lamp 164 by accommodating inserted fingers therein. This action pushes the alignment pins 378, 380 into the alignment holes 194, 196 in preparation for the electrical pins 388, 390, 392 and water valve 382, 384 making contact. When the latch lever 312 is pushed completely down, or closed, the UV LED lamp 164 will be pushed firmly against the connection portion 160 and all connections are then tightly and properly accomplished. A person of ordinary skill in the art will recognize that alignment pins 378, 380 and alignment holes 194, 196 may be present on either the connection portion or lamp and that equivalent structures may be used in lieu of the alignment pins 378, 380 and alignment holes 194, 196. Additionally, a person of ordinary skill in the art will recognize that the latch bar guide 182 and alignment bar 376 may be present on either the instant connection portion and lamp as well and that equivalent structures to the latch bar guide and alignment bar are within the contemplated scope of this invention.

Figure 12A:
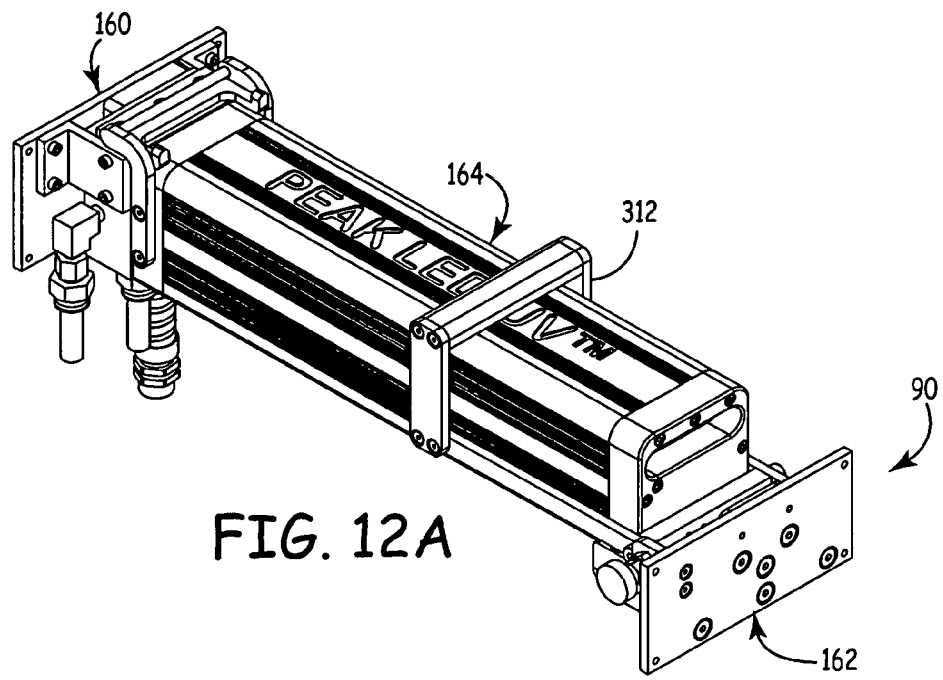
FIG. 12A is a perspective view of the instant docking port and UV LED lamp in a lowered position.
Figure 12B:
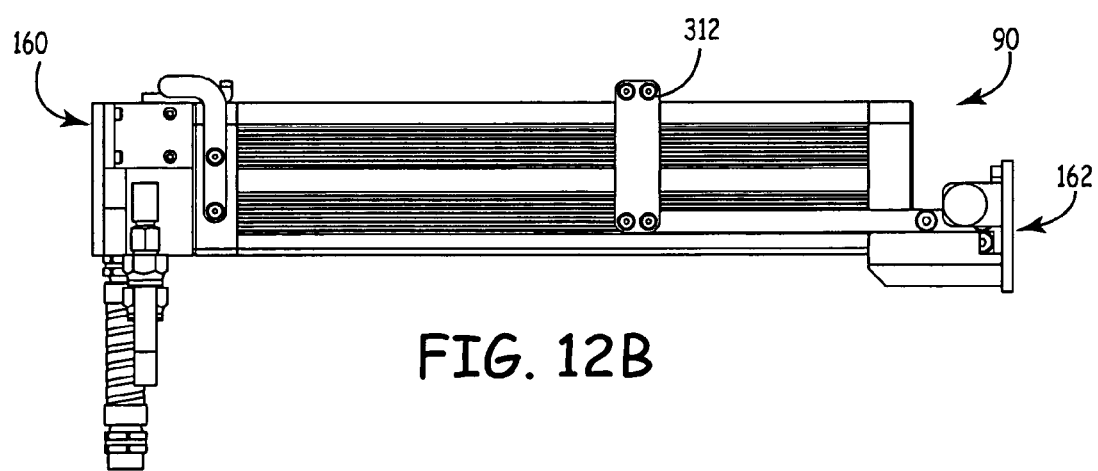
FIG. 12B is a side view of the instant docking port and the UV LED lamp of FIG. 12A.

FIGS. 12A, 12B depict docking portions 160, 162 with the UV LED lamp 164 in place with the latch lever 312 in the down or closed position. With the latch lever 312 in the down or closed position, the locking pin 324 can snap into place, thus preventing the latch lever 312 from being pulled open unintentionally. The UV LED lamp 164 is thusly pinched or clamped tightly between the docking portions 160, 162, the UV LED lamp 164 hence pressed firmly against the connection portion 160 of the docking port to ensure that all connections are proper and sealed. In such a position, the UV LED lamp 164 cannot be removed.

Because numerous modifications of this invention may be made without departing from the spirit thereof, the scope of the invention is not to be limited to the embodiments illustrated and described. Rather, the scope of the invention is to be determined by the appended claims and their equivalents.

What is claimed is:

1. A docking port for securing a lamp emitting radiation toward a substrate in a printing press, the docking port comprising:
   a connection portion, said connection portion having fluid and electrical connectors mating with corresponding fluid and electrical connectors in said lamp; and
   a cradle portion, said cradle portion including a cradle accommodating a portion of said lamp and a latch arm assembly securing said lamp into said cradle and against said connection portion,
   said latch arm assembly pivotable between an open position in which said lamp can be removed from or inserted into said docking port and a closed position in which said lamp is secured to said docking port.

2. The docking port of claim 1, in which the connection portion includes an alignment hole aligning with an aligning pin present on said lamp.

3. The docking port of claim 1, in which the connection portion includes a latch bar guide attaching to an alignment bar present on said lamp.

4. The docking port of claim 1, in which the connection portion includes a female electrical block electrically accommodating pins present on said lamp.

5. The docking port of claim 1, in which a plurality of valves provide fluid to said lamp when said lamp is secured in said docking port.

6. The docking port of claim 5, in which said connection portion comprises said valves.

7. The docking port of claim 1, in which said cradle portion includes a securing device securing the latch arm assembly in an open position.

8. The docking port of claim 7, in which the securing device includes a spring plunger.

9. The docking port of claim 1, in which the cradle portion includes a pivot plate and in which the latch arm assembly includes a plurality of pivotable latch arms attached to the pivot plate, a plurality of latch handle arms, each latch handle arm attached to one of the latch arms, and a latch handle attached to each of the latch handle arms.

10. The docking port of claim 9, in which the cradle portion further includes a push plate pivotally attached to the latch arm assembly and a push pad attachable to the push plate.

11. The docking port of claim 1, in combination with an offset printing press, the docking port mounted so as to direct radiation at a critical point of said printing press.

12. The docking port of claim 1, in combination with an offset sheet-fed printing press, the docking port disposed so as to direct radiation at a critical location present in said printing press.

13. A docking port for securing a lamp emitting radiation toward a substrate in a printing press, the docking port comprising:
   a connection portion, said connection portion having means for aligning electrical and fluid components present in said lamp; and
   a cradle portion, said cradle portion including a cradle accommodating the lamp, a pivotable latch arm assembly, and a push plate mounted to said latch arm assembly, the latch arm assembly securing the lamp in the cradle and the push plate biasing the lamp against the connection portion.

14. The docking port of claim 13, in combination with a printing press, the docking port mounted proximate a critical point of said printing press.

15. A method of curing an ink, a coating, or an adhesive deposited on a substrate traveling a path through a printing press, the method including directing UV radiation at said ink, coating, or adhesive when said ink, coating, or adhesive is present in a critical location within said printing press, the UV radiation emitting from a lamp secured in a docking port mounted to said printing press, said docking port comprising a connection portion and a cradle/latch portion, said connection portion including an alignment hole and providing coolant and electricity to said lamp, the alignment hole aligning with an aligning pin present on said lamp when said lamp is secured in said docking port, said cradle/latch portion including a cradle and an arm assembly, said arm assembly securing said lamp in said cradle and against said connection portion.

16. A method of securing a lamp into a docking port, the docking port attached proximate a critical location of a printing press and comprising a connection portion and a cradle/latch portion, the method comprising:
   placing said lamp in said docking port; and
   displacing a latch arm assembly of said cradle/latch portion from an open position to a closed position, thereby securing said lamp in said docking port.

17. The method of claim 16, in which the docking port comprises alignment holes and the lamp comprises alignment pins, and in which the method further comprises inserting the alignment pins into the alignment holes.

18. The method of claim 16, further comprising providing coolant and electricity to said lamp.

19. The method of claim 16, in which the cradle/latch portion further comprises a push plate pivotally connected to said latch arm assembly and in which the push plate biases the lamp against the connection portion as the latch arm is displaced from said open position to said closed position.

20. The method of claim 16, further comprising disengaging a locking mechanism before displacing said latch arm assembly.

21. The method of claim 16, in which the connection portion includes a female electrical block accommodating electrical pins from the lamp and in which said pins are accommodated in said female electrical block when said latch arm is displaced from said open position to said closed position.

22. A method of attaching a docking port to a printing press, the docking port comprising a connection portion and a cradle/latch portion, the method comprising mounting said connection portion and said latch portion such that a lamp can be secured in said docking port, such that said lamp directs UV radiation at a critical location and such that a cradle arm assembly of said cradle/latch portion biases said lamp against said connection portion.

23. The method of claim 22, in which said cradle/latch portion includes a cradle and in which said lamp is secured in said cradle when said cradle arm assembly is pivoted from an open position to a closed position.

* * * * *